(12) United States Patent
Zeller et al.

(10) Patent No.: US 11,054,493 B2
(45) Date of Patent: Jul. 6, 2021

(54) OPTIMIZED BLADE IMAGING

(71) Applicant: Siemens Healthcare GmbH, Erlangen (DE)

(72) Inventors: Mario Zeller, Erlangen (DE); Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/676,692

(22) Filed: Nov. 7, 2019

(65) Prior Publication Data
US 2020/0142014 A1    May 7, 2020

(30) Foreign Application Priority Data
Nov. 7, 2018 (EP) .................................... 18204892

(51) Int. Cl.
*G01R 33/483* (2006.01)
*G01R 33/48* (2006.01)
*G01R 33/565* (2006.01)

(52) U.S. Cl.
CPC ..... *G01R 33/4835* (2013.01); *G01R 33/4824* (2013.01); *G01R 33/56545* (2013.01)

(58) Field of Classification Search
CPC ............ G01R 33/4835; G01R 33/4824; G01R 33/56545; G01R 33/5617; G01R 33/543; G01R 33/482; G01R 33/4818
See application file for complete search history.

(56) References Cited

U.S. PATENT DOCUMENTS

2014/0043024 A1* 2/2014 Gui .................. G01R 33/4824
324/309

OTHER PUBLICATIONS

Skare, Stefan et al., "Image domain propeller fast spin echo," Magnetic Resonance Imaging, vol. 31, No. 3, pp. 385-395, Apr. 2013 // https://doi.org/10.1016/j.mri.2012.08.010.
Pipe, James G. et al., "Turboprop: Improved PROPELLER imaging," Magnetic Resonance in Medicine, vol. 55, No. 2, pp. 380-385, 2006 // https://doi.org/10.1002/mrm.20768.
Arfanakis, Konstantinos et al., "k-Space Undersampling in PROPELLER Imaging," Magnetic Resonance in Medicine, vol. 53, No. 3, pp. 675-683, Mar. 2005 // https://doi.org/10.1002/mrm.20380.
European Search Report for Application No. 18204892.6, dated May 21, 2019.

* cited by examiner

*Primary Examiner* — Rishi R Patel
(74) *Attorney, Agent, or Firm* — Schiff Hardin LLP (57) ABSTRACT

In a method for generating an MR image of an object, k-space of the MR image is separated into blades. In each blade, parallel k-space lines are provided which are separated in a phase encoding direction (PED). Each blade has a different rotation angle around a common center relative to the remaining blades. A spatial extent of the object is determined. For the blades, the extent of the object in the corresponding PED is determined. A blade specific extent of a field of view (FOV) in the PED is determined for each of the blades based on the corresponding extent of the object in the PED. The extent of the FOV in the PED differs for at least one of the blades from the extent of the remaining blades, and sampling the k-space with the blades with the determined blade specific FOV as determined for each of the blades.

20 Claims, 4 Drawing Sheets

OPTIMIZED BLADE IMAGING

CROSS REFERENCE TO RELATED APPLICATIONS

This patent application claims priority to European Patent Application No. 18204892.6, filed Nov. 7, 2018, which is incorporated herein by reference in its entirety.

BACKGROUND

Field

The present disclosure relates to a method for generating an MR image of an object under examination in an MR imaging system, to the MR imaging system and to a computer program including program code. Furthermore, a carrier including the computer program is provided.

Related Art

Blade imaging is a motion insensitive MR imaging sequence where the MR signals are acquired in blades which include parallel phase-encoding lines. Individual blades are rotated to cover a circle in the raw data or k-space, wherein typically 5 to 15 blade orientations are acquired per acquisition. As the central k-space is sampled for each blade and as additional retrospective motion correction can be applied, the technique is relatively robust towards motion.

In contrast to conventional Cartesian two-dimensional imaging where only one phase encoding direction exists, the phase encoding direction changes for each acquired blade. In order to avoid folding artifacts, the user has to carefully select the field of view, FOV, in such a way that it is chosen large enough for the examined person. This is especially problematic in the abdominal or thoracic region.

One option to avoid folding artifacts is the use of phase oversampling. Phase oversampling is a technique which is used when the anatomic dimensions of the object under examination exceed the defined field of view. This can lead to the fact that portions of the object outside the field of view are misinterpreted in terms of frequency or phase and are folded over into the MR image from the peripheral part of the image. This effect is mainly seen in the phase encoding direction.

For the blade technology the phase encoding direction changes and an increase of the field of view which is sufficient for one of the phase encoding directions might not be sufficient for other phase encoding directions. This leads to unnecessarily large fields of view for the blade acquisition and thus increases the total acquisition time.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure overcomes the above-mentioned problem and provides a method for providing a blade imaging sequence in which the wrap-around artifacts are minimized while keeping the total image acquisition time low.

According to a first aspect, a method for generating an MR image of an object under examination in an MR imaging system is provided, where k-space of the MR image is separated into several blades, and wherein in each blade a plurality of parallel k-space lines are provided which are separated in a phase encoding direction and wherein each of the several blades has a different rotation angle around a common center relative to the remaining of the several blades. Furthermore, a spatial extent of the object under examination is determined and the extent of the object in the corresponding phase encoding direction is determined for the several blades. According to the method, a blade specific extent of the field of view in the phase encoding direction is determined for each of the several blades taking into account the corresponding extent of the object in the phase encoding direction. The size of the field of view in the phase encoding direction differs at least for one of the several blades from the size of the remaining blades. The MR image is then generated by sampling k-space with the several blades with the determined blade specific field of view as determined for each of the blades.

With the proposed method, the field of view in the phase encoding direction depends on the spatial extent of the object under examination. As the extent of the object differs for the different phase encoding directions, a blade specific field of view and thus a blade specific number of phase encoding lines is used during image acquisition for the blades. For at least one of the blades of the several blades, the distance between neighboring parallel k-space lines is different from the distance of the k-space lines of the other blades.

The spatial extent of the object can be determined by detecting MR signals of the object under examination in at least two orthogonal directions within one imaging plane. Furthermore, the spatial extent of the object under examination is determined based on the at least two orthogonal MR signals. With the two orthogonal orientations, at least a minimum and a maximum extent of the object under examination can be determined so that the blade specific extent of the field of view can be determined taking into account the minimum and maximum extent of the field of view in the phase encoding direction.

The MR signals used for determining the spatial extent can be determined either in a pre-scan or by a sequence-inherent navigator.

It is possible that the MR signals are only detected in two orthogonal orientations with an imaging sequence which provides, for each of the orientations, a one-dimensional projection of the MR signals along the corresponding orientation within the imaging plane. The maximum and the minimum spatial extent of the object under examination can then be determined based on the two one-dimensional projections. The blade specific extent of the field of view can then be determined based on the maximum and the minimum spatial extent of the object under examination.

Often the folding artifacts occur in only one direction due to the geometry of the examined object, and when the maximum spatial extent of the object under examination is determined, the blade specific field of view can be increased for this direction of the maximum spatial extent, whereas it is kept at a constant value for the other blades extending with the phase encoding direction in any of the other directions.

Furthermore, it is possible that the spatial extent in the phase encoding direction is determined separately for each orientation of the different blades by detecting MR signals of the object under examination for each of the orientations. The blade specific extent of the field of view is then determined for each blade orientation so that for each blade a blade specific extent of the field of view can be determined and thus the k-space distance between two neighboring lines.

It is possible to determine the k-space distance between two parallel phase encoding lines for each of the blades in dependence on the corresponding extent of the field of view in the phase encoding direction.

Furthermore, it may be determined that the blade specific field of view is larger for a first blade than for a second blade of the several blades. In this situation, k-space of the first blade may be sampled at least a second time with the second sampling being shifted in the phase encoding direction relative to the first sampling by half a distance of two neighboring k-space lines of the first sample of the first blade. The second blade may then only be sampled once.

This means in this example that for one of the blades where there is the largest extent of the field of view in the phase encoding direction, the corresponding blade is sampled simply twice, wherein a second acquisition is shifted against the first one by $\Delta k/2$, where $\Delta k$ is the distance between two neighboring parallel phase encoding lines and $\Delta k=1/FOV$.

Accordingly, it is possible that only two different k-space distances are used to sample the complete k-space and at least one of the several blades, namely the blade having the largest field of view in the phase encoding direction, is sampled with a smaller k-space distance compared to the other remaining blades.

When the field of view in the phase encoding direction is determined for each of the blades separately, a blade specific k-space distance can be determined for each of the several blades and k-space is then sampled with the blade specific k-space distance.

As far as the imaging sequence is concerned, the imaging sequence can be a multi-echo spin-echo sequence, in which after an excitation RF pulse all phase encoding lines of a single blade are sampled with a plurality of refocusing pulses. Here the number of parallel k-space lines for the different blades can now depend for at least one of the blades on the corresponding field of view in the phase encoding direction as it was determined for this one blade. The echo time at which the k-space line passes through the center of k-space can then be determined for all of the blades in such a way that it is the same for all blades. This means that the time from the excitation pulse to the echo time where one of the k-space lines for a blade passes through the center of k-space is substantially the same for all the blades. This is preferred, as the same contrast should be generated throughout the image acquisition and as the k-space line passing through the center of k-space is mainly responsible for the contrast, it may be advantageous to select the acquisition of the MR signal in such a way that for each of the blades the echo time TE is the same independent of the number of k-space lines sampled per blade.

Furthermore, an MR imaging system configured to generate the MR image of the object under examination is provided, wherein the imaging system includes at least one MR signal detection coil configured to detect the MR signals of the object under examination. Furthermore, at least one controller is provided configured to control the imaging sequence used to generate the MR image which operates according to a method as mentioned above or as discussed in further detail below.

Furthermore, a computer program comprising program code to be executed by at least one controller of the MR imaging sequence is provided, wherein execution of the program code causes the at least one controller to execute a method as mentioned above or as discussed in further detail below.

Additionally, a carrier such as a computer-readable medium (e.g. memory, CD-ROM, etc.) is provided comprising the computer program.

It should be understood that the features mentioned above and features yet to be explained below can be used not only in the respective combinations indicated, but also in other combinations or in isolation without departing from the scope of the present application. Features of the above-mentioned aspects and embodiments described below may be combined with each other in other combinations unless explicitly mentioned otherwise.

In the following embodiments of the disclosure will be described in detail with reference to the accompanying drawings. It should be understood that the following description of embodiments is not to be taken in a limiting sense. The scope of the disclosure is not intended to be limited by the embodiments described hereinafter or by the drawings, which are to be illustrative only.

The drawings are to be regarded as being schematic representations, and elements illustrated in the drawings are not necessarily shown to scale. Rather, the various elements are represented such that their function and general purpose becomes apparent to a person skilled in the art. Any connection or coupling between functional blocks, devices, components of physical or functional units shown in the drawings and described hereinafter may be implemented by an indirect connection or coupling. A coupling between components may be established over a wired or wireless connection. Functional blocks shown in the drawings may be implemented in hardware, software, firmware, or a combination thereof.

Figure 1:
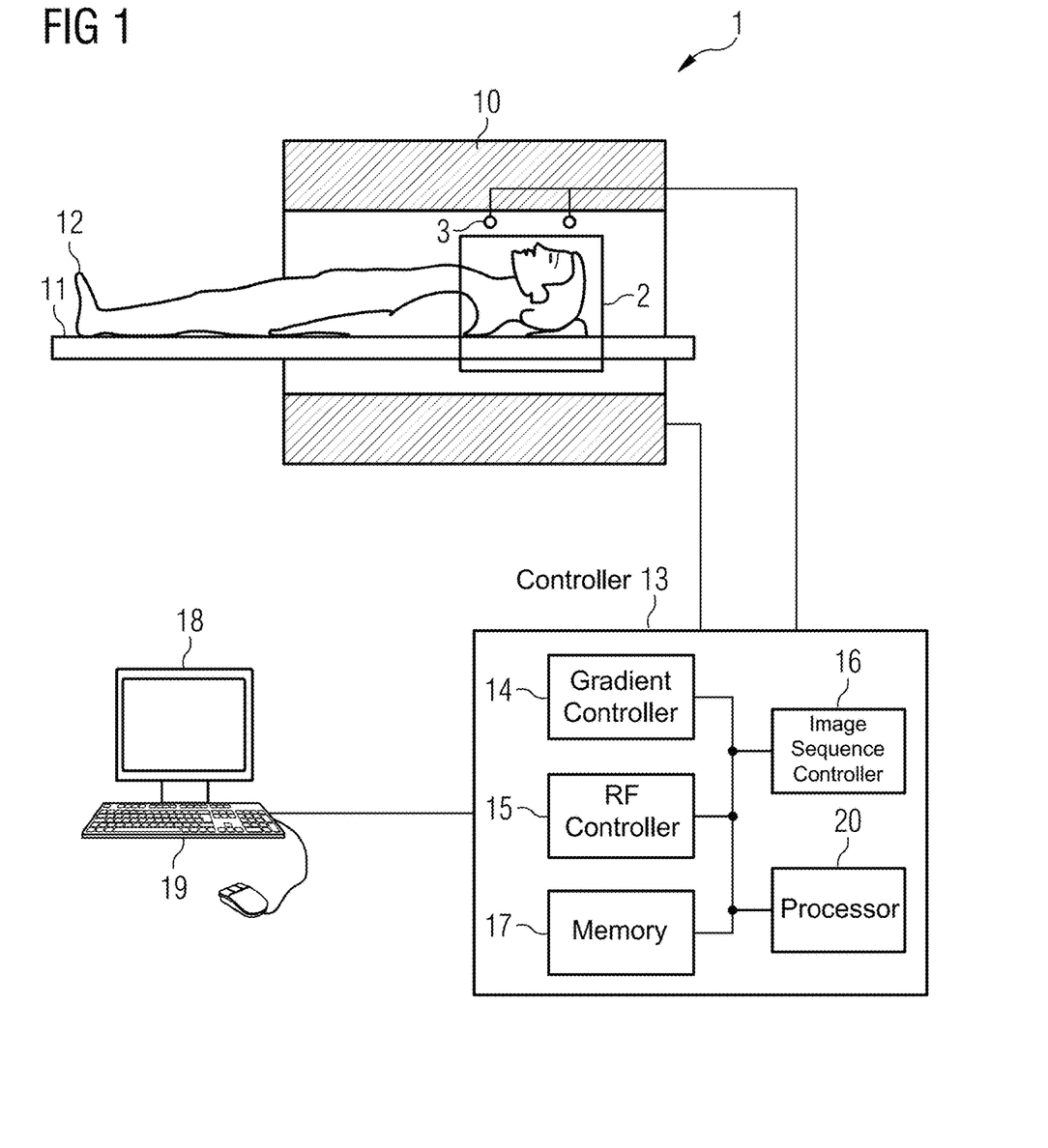
FIG. 1 shows a MR system configured to use an optimized blade imaging sequence according to an exemplary embodiment.

FIG. 1 shows a schematic view of an MR system 1 according to an exemplary embodiment. The MR system 1 is configured to operate with an optimized blade imaging sequence in an exemplary embodiment.

In an exemplary embodiment, the MR system 1 includes a magnet 10 generating a polarization field BO. An object under examination 12 lying on a table 11 is moved into the center of the MR system where MR signals generated by RF excitation pulses can be detected with receiving coils 2 or 3. The coils may also be used for transmitting the RF pulses into the object under examination. With the application of RF pulses and magnetic field gradients, the nuclear spins of the object 12 are excited and the currents induced by the relaxation are detected. The general way how MR images are generated and how the MR signals are detected using a sequence of RF pulses and a sequence of magnetic field gradients determined by an imaging sequence is known to a person skilled in the art so that a detailed explanation thereof is omitted.

In an exemplary embodiment, the MR system 1 includes a controller 13 which is configured to control the MR system. In an exemplary embodiment, the controller 13 includes a gradient controller 14 configured to control the switching the magnetic field gradients needed for the spatial encoding of the MR signals. An RF controller 15 is provided configured to generate the RF pulses that are needed for the imaging sequence used. An imaging sequence controller 16 is provided configured to control in dependence on the fact which imaging sequence is selected, the sequence of the applied RF pulses and the used magnetic field gradients and thus controls in part the gradient controller 14 and the RF controller 15. In a memory 17 computer programs needed for operating the MR system and the imaging sequences necessary for generating the MR images can be stored together with the generated MR images. The generated MR images may be displayed on a display 18, wherein an input unit or human machine interface 19 is provided used by a user of the MR system to control the functioning of the MR imaging system. A processor 20 is provided which can coordinate the operation of the different functional units shown in FIG. 1 and which can include one or more processors which can carry out the instructions stored on the memory 17. The memory 17 can include this program code to be executed by the processor 20 so as to implement the disclosure as discussed above or as discussed in further detail below. In an exemplary embodiment, the controller 13 (or one or more components therein) includes processor circuitry that is configured to perform one or more respective functions and/or operations of the controller 13 (or respective component(s)).

In an exemplary embodiment, as will be explained below, the controller 13, the imaging sequence controller 16 and/or the processor 20 are configured such that an MR image can be generated using a blade technology having an optimized acquisition time while suppressing the occurrence of folding artifacts.

Figure 2:
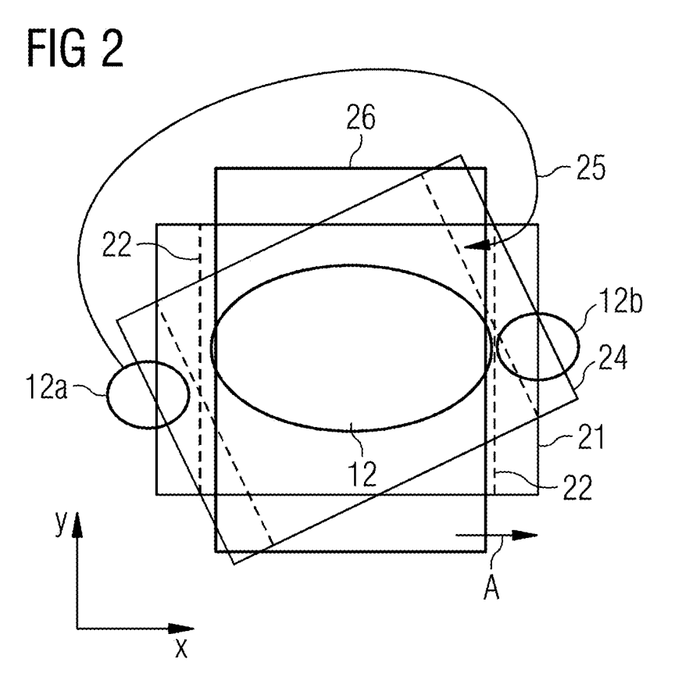
FIG. 2 shows an exemplary use of phase oversampling for different orientations of the field of view and the phase encoding direction according to an exemplary embodiment to avoid folding artifacts.

FIG. 2 shows an example schematic representation of an imaging slice of the object under examination 12, according to an exemplary embodiment, in which the two arms 12a and 12b are present. FIG. 2 shows different fields of view that are used during the imaging of the object under examination with a blade technology in which k-space is sampled with a plurality of blades in which each blade has a plurality of parallel k-space lines which are separated in the phase encoding direction and in which each of the blades has a different rotation angle around a common center relative to the other blades.

FIG. 2 shows a first orientation of the field of view 21. In this transversal orientation the folding of the arms 12a and 12b due to the folding artefact is not visible in the final MR image, as the image was cropped accordingly as shown by the dashed line 22. The phase encoding direction for the field of view 21 is indicated by the arrow A in FIG. 2 and is thus from left to right or in the x-direction shown in the figure. Additionally, a rotated field of view 24 is shown. In this orientation folding artifacts of arm 12a occur in the upper right corner as indicated by arrow 25, if the coverage in the phase encoding direction is not sufficient for this kind of angulation. A further orientation of the field of view 26 is shown in which the phase encoding direction is now along the y-direction shown in the figure. As can be deduced, the field of view 26 is unnecessarily large compared with the extent of the object under examination 12 in the vertical phase encoding direction.

In the following, a method is proposed which advantageously avoids the folding or wrap-around artifacts and reduces the total acquisition time. The main idea is the use of a blade specific extent of the field of view in the phase encoding direction so as to control the folding artifacts by avoiding Nyquist folding which occurs when frequencies occur in one direction that are larger than the sampling frequency in the corresponding direction. Accordingly, the Nyquist sampling is controlled in dependence on the blade orientation.

To this end, the spatial extent of the object under examination is determined.

Figure 3:
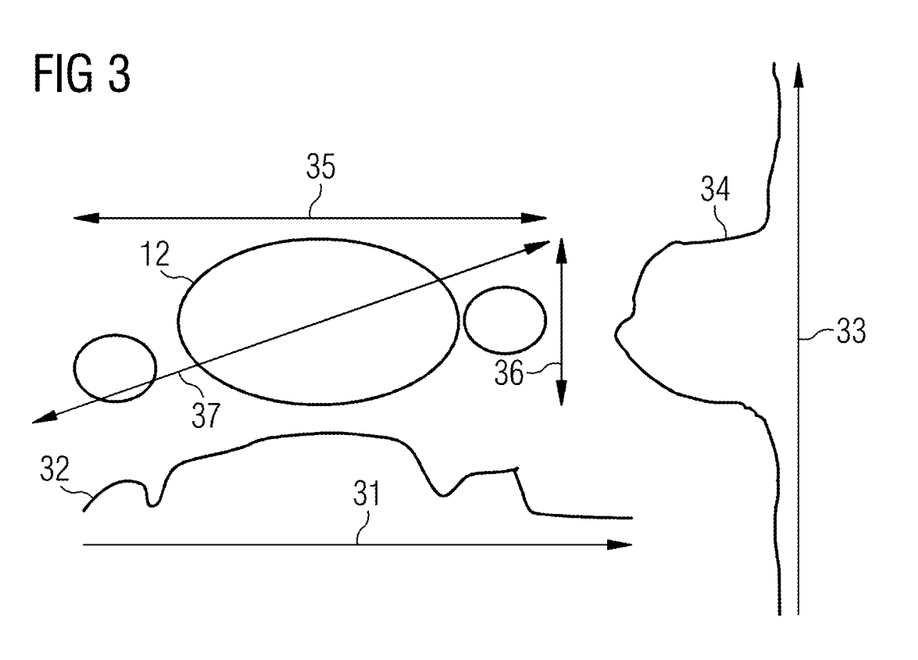
FIG. 3 shows two projection scans according to an exemplary embodiment in which MR signals are detected to determine the spatial extent of the object under examination with only two signal acquisitions.

FIG. 3 shows a process according to an exemplary embodiment to determine the spatial extent of the object under examination 12. To this end a navigator scan or any other pre-scan may be carried out for the object under examination, by way of example with only a central k-space line in two orthogonal directions. This yields a projection of the object under examination in the two different directions. By way of example, when a first projection imaging sequence with a projection of the MR signal in direction 31 is measured, a projection 32 of the object under examination is obtained as shown in FIG. 1. From projection 32 one can identify the two arms and the main body of the examined person. With a second orthogonal projection in the direction 33 the other projection 34 is obtained indicating the extent of the examined object in the other direction, here the vertical direction compared to the horizontal direction. Based on these two projections the maximum and the minimum extent of the object under examination can be determined. By way example for a blade having the phase encoding direction as shown by arrow 31 the extent of the object in this direction can be determined by projection 32, wherein the extent in the other direction for a further blade as shown by arrow 36 can be determined from projection 34 here the minimum extension. For a phase encoding direction as shown by arrow 37, the maximum extent of the object under examination may be determined by way of example with the Euclidean distance, i.e. the root of the sum of the square of the extension in the horizontal and the square of the extension in the vertical direction. When the extent of the object under examination in a certain phase encoding direction is known, the distance between two neighboring k-space lines in the phase encoding direction is determined accordingly with the knowledge of the FOV in this direction with the equation $\Delta k_{max,n}=1/FOV_n$.

Figure 4:
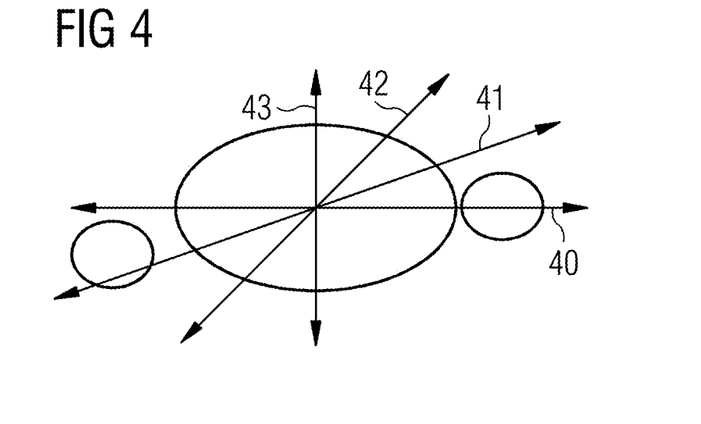
FIG. 4 shows a schematic representation of a determination of the spatial extent of the object under examination for each of the different blades according to an exemplary embodiment.

FIG. 4 shows a process according to an exemplary embodiment to determine the extent of the field of view for each of the blade directions separately by acquiring MR image signals for each of the different blade directions 40, 41 and 42 and 43, e.g. with an imaging sequence as explained above in connection with FIG. 4.

Figure 5:
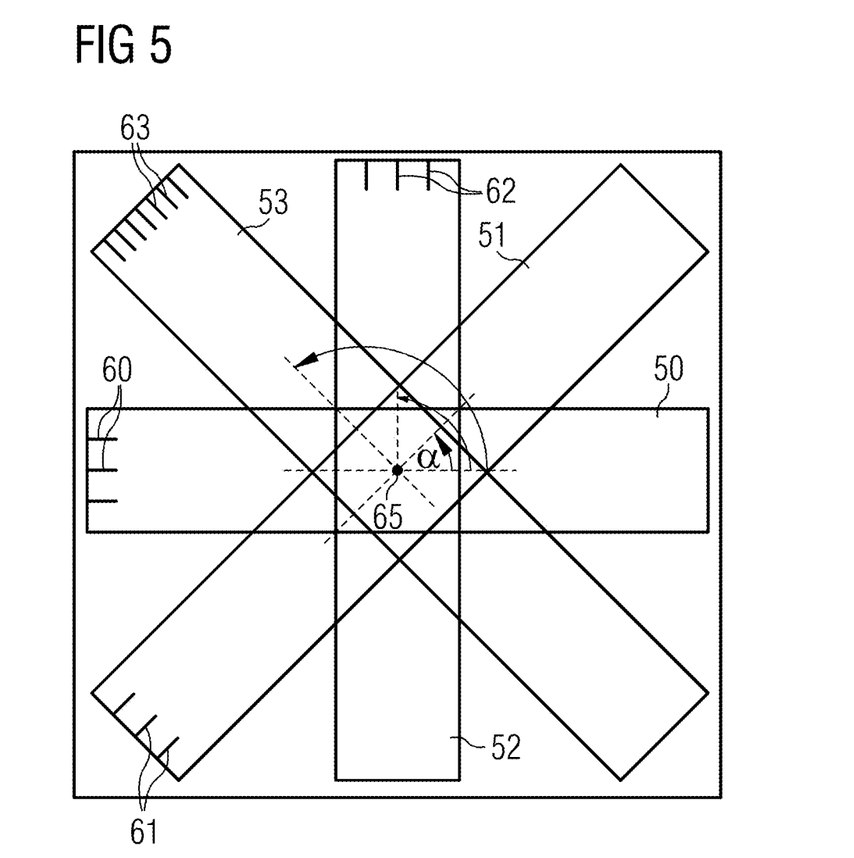
FIG. 5 shows a schematic k-space sampling with an imaging sequence with a blade specific extent of the field of view according to an exemplary embodiment.

FIG. 5 shows a blade specific extent of the field of view according to an exemplary embodiment. In the example shown, k-space with four different blades with different blade orientations 50 to 53 are shown, wherein the different blades are rotated around a common center 65 with different rotation angles α as shown. In the embodiment shown it is assumed that the field of view in the phase encoding direction was the same for blades 50, 51 and 52 as shown by the separation of the corresponding k-space lines 60, 61 and 62. As can be seen, for blade 53 the extent of the field of view in the phase encoding direction is larger as was also shown in FIG. 3 for projection 37. Here a larger field of view in the phase encoding direction was used which translates into a smaller distance between neighboring k-space lines 63. The k-space distance can be calculated from the determined field of view and the corresponding phase encoding direction with $\Delta k_{max}=1/FOV$.

Furthermore, it is possible to take into account a potential patient movement so that a relative or absolute safety margin can be added to the determined field of view.

Depending on the required number of k-space points the number of samples per blade can be increased. In a simplified example the blades covering the maximum patient extent can be sampled twice, here in the embodiment of FIG. 5 blade 53. In the second shot, the k-space distance is shifted by $\Delta k/2$, which leads to an increase of the k-space density by two, which corresponds to a phase oversampling of 100%.

It should be understood that the k-space distance may also be different for each of the blades 50 to 53 in dependence on the corresponding field of view in the phase encoding direction. By way of example in the situation shown in FIG. 3 the number of k-space lines for blade 50 can be selected smaller than for blade 52 and again smaller for blade 52 compared to blade 53. Alternatively, the distance of the k-space lines for blade 50 can be increased while keeping the amount of k-space lines identical. This leads to an improved spatial resolution of the respective blade image.

As an imaging sequence a fast spin-echo sequence may be used in which each blade is sampled after a single RF excitation pulse, wherein each k-space line is sampled after one refocusing pulse. When the number of k-space lines differs for each of the blades, the echo time for this multi-echo sequence can now be adapted in such a way that the time when the k-space line passing through the center 65 is sampled is substantially the same for all blades in order to make sure that the same contrast is obtained in the generated image in view of the T1 and T2 relaxation occurring during image signal acquisition.

Alternatively, in an exemplary embodiment, the echo times for the sampling of the central k-space line can vary between the different blades but are determined in a way that an average echo time is maintained when combining all blades during image reconstruction.

Figure 6:
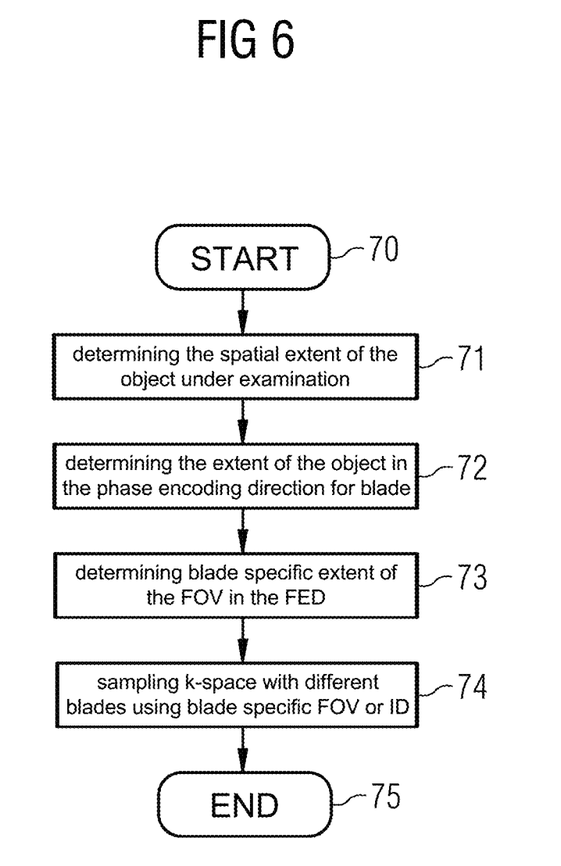
FIG. 6 shows a flowchart of a method carried out by the MR system according to an exemplary embodiment for determining an imaging sequence having a blade specific field of view.

FIG. 6 shows a flowchart of a method according to an exemplary embodiment to sample k-space with an optimized blade sequence. The method starts in step 70 and in step 71 the spatial extent of the object under examination is determined. As discussed in connection with FIG. 2, image signals might be used obtained in different projection directions. Furthermore, imaging data from a localizer or any adjustment scan carried out before the imaging sequence is actually started may be used to determine the spatial extent of the examined person. In step 72, for each of the blades, the extent of the object in the corresponding phase encoding direction (FED) is determined and in step 73 a blade specific extent of the field of view (FOV) is determined in the phase encoding direction based on the determined extent of the object in the corresponding phase encoding direction of step 72. As a result, a plurality of blades is obtained in which one blade has a different k-space distance for the k-space lines, so that not all blades have the same k-space distance between neighboring lines. With the blade specific extent of the field of view, and thus with the blade specific k-space density for the different blades, the image can be sampled in step 74 by sampling k-space with the different blades using the blade specific field of view or blade specific imaging density (ID) of the k-space lines.

The method ends in step 75.

Summarizing, the k-space sampling density is varied for the different blades based on the blade individual field of view in the phase encoding direction so that wrap-around artifacts are avoided, the scan time needed to generate the MR image is minimized and the generation of the blade imaging sequence is obtained with an increased automation, as the blade specific field of view can be automatically determined for each of the blades.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for generating magnetic resonance (MR) image of an object under examination in an MR imaging system, the method comprising:
   separating k-space of the MR image into blades, wherein in each of the blades, a plurality of parallel k-space lines are provided which are separated in a phase encoding direction, and wherein each of the blades has a different rotation angle around a common center relative to remaining ones of the blades;
   determining a spatial extent of the object under examination;
   determining, for the blades, the spatial extent of the object under examination in the corresponding phase encoding direction;
   determining a blade specific spatial extent of a field of view in the phase encoding direction for each of the blades based on the determined corresponding spatial extent of the object under examination in the phase encoding direction, the spatial extent of the field of view in the phase encoding direction differing for at least one of the blades from the spatial extent of the remaining ones of the blades; and
   sampling k-space with the blades for generating the MR image with the determined blade specific field of view as determined for each of the blades.

2. The method according to claim 1, wherein determining the spatial extent of the object under examination comprises:
   detecting MR signals of the object under examination in at least two orthogonal orientations within one imaging plane; and
   determining the spatial extent of the object under examination based on the at least two orthogonal MR signals.

3. The method according to claim 2, wherein the MR signals are detected in only two orthogonal orientations with an imaging sequence that provides, for each of the two orientations, a one-dimensional projection of the MR signals along the corresponding orientation within said one imaging plane, wherein a maximum and a minimum spatial extent of the object under examination is determined based on the two one-dimensional projections, the blade specific spatial extent of the field of view being determined based on the maximum and minimum spatial extent of the object under examination.

4. The method according to claim 1, wherein the spatial extent in the phase encoding direction is determined separately for each orientation of the blades by detecting MR signals of the object under examination, the blade specific spatial extent of the field of view being determined for each blade orientation.

5. The method according to claim 2, wherein the spatial extent in the phase encoding direction is determined separately for each orientation of the blades by detecting MR signals of the object under examination, the blade specific spatial extent of the field of view being determined for each blade orientation.

6. The method according to claim 1, further comprising determining a k-space distance between two parallel phase encoding lines for each of the blades based on the corresponding spatial extent of the field of view in the phase encoding direction.

7. The method according to claim 1, wherein, when the blade specific field of view is determined to be larger for a first blade of the blades than for a second blade of the blades: k-space of the first blade is sampled at least a second time with a second sampling being shifted in the phase encoding direction relative to a first sampling by half a distance of two neighboring k-space lines of a first sample of the first blade, and the second blade being sampled only once.

8. The method according to claim 6, wherein only two different k-space distances are used to sample the complete k-space, and wherein at least one of the blades is sampled with a smaller k-space distance compared to the remaining ones of the blades.

9. The method according to claim 7, wherein only two different k-space distances are used to sample the complete k-space, and wherein at least one of the blades is sampled with a smaller k-space distance compared to the remaining ones of the blades.

10. The method according to claim 6, wherein a blade specific k-space distance is determined for each of the blades, and k-space is sampled with the blade-specific k-space distance.

11. The method according to claim 7, wherein a blade specific k-space distance is determined for each of the blades, and k-space is sampled with the blade-specific k-space distance.

12. The method according to claim 1, wherein the MR image is generated using a multi-echo spin-echo sequence, in which after an excitation RF pulse, all phase encoding lines of a single blade of the blades are sampled with a plurality of refocusing pulses.

13. The method according to claim 12, wherein a number of parallel k-space lines for the different ones of the blades depends, for at least one of the blades, on the corresponding field of view in the phase encoding direction determined for said at least one blades, wherein an echo time at which the k-space line passing through a center of k-space is the same for all of the blades.

14. A non-transitory computer-readable storage medium with an executable program stored thereon, that when executed, instructs a processor to perform the method of claim 1.

15. A non-transitory computer-readable storage medium having a computer program which is directly loadable into a memory of a controller of the magnetic resonance device, when executed by the controller, causes the magnetic resonance device to perform the method as claimed in claim 1.

16. A magnetic resonance (MR) imaging system configured to generate an MR image of an object under examination, the imaging system comprising:
- a MR signal detection coil configured to detect MR signals of the object under examination; and
- a controller configured to control an imaging sequence used to generate the MR image, the controller being configured to:
  - separate k-space of the MR image in blades, wherein in each of the blades, a plurality of parallel k-space lines are provided which are separated in a phase encoding direction, and wherein each of the blades has a different rotation angle around a common center relative to remaining ones of the blades;
  - determine a spatial extent of the object under examination;
  - determine, for the blades, the spatial extent of the object under examination in the corresponding phase encoding direction;
  - determine a blade specific spatial extent of a field of view in the phase encoding direction for each of the blades based on the determined corresponding spatial extent of the object under examination in the phase encoding direction, the spatial extent of the field of view in the phase encoding direction differing for at least one of the blades from the spatial extent of the remaining ones of the blades; and,
  - sample k-space with the blades for generating the MR image with the determined blade specific field of view as determined for each of the blades.

17. The MR imaging system according to claim 16, wherein, to determine the spatial extent of the object under examination, the controller is configured to:
- detect MR signals of the object under examination in at least two orthogonal orientations within one imaging plane; and
- determine the spatial extent of the object under examination based on the at least two orthogonal MR signals.

18. The MR imaging system according to claim 17, wherein the MR signals are detected in only two orthogonal orientations with an imaging sequence that provides, for each of the two orientations, a one-dimensional projection of the MR signals along the corresponding orientation within said one imaging plane, wherein a maximum and a minimum spatial extent of the object under examination is determined based on the two one-dimensional projections, the blade specific spatial extent of the field of view being determined based on the maximum and minimum spatial extent of the object under examination.

19. The MR imaging system according to claim 16, wherein the spatial extent in the phase encoding direction is determined separately for each orientation of the blades by detecting MR signals of the object under examination, the blade specific spatial extent of the field of view being determined for each blade orientation.

20. The method according to claim 1, wherein the spatial extent of the object under examination is determined in an image space and based on MR signals acquired from the object under examination.

\* \* \* \* \*